US012220640B2

(12) United States Patent
Liu et al.

(10) Patent No.: US 12,220,640 B2
(45) Date of Patent: Feb. 11, 2025

(54) GENERATIVE INTERIOR DESIGN IN VIDEO GAMES

(71) Applicant: Electronic Arts Inc., Redwood City, CA (US)

(72) Inventors: Han Liu, Millbrae, CA (US); Jingwen Liang, Mountain View, CA (US); Schaefer Mitchell, Beaverton, OR (US); Mohsen Sardari, Burlingame, CA (US)

(73) Assignee: ELECTRONIC ARTS INC., Redwood City, CA (US)

( * ) Notice: Subject to any disclaimer, the term of this patent is extended or adjusted under 35 U.S.C. 154(b) by 788 days.

(21) Appl. No.: 17/463,754

(22) Filed: Sep. 1, 2021

(65) Prior Publication Data
US 2023/0061250 A1    Mar. 2, 2023

(51) Int. Cl.
*A63F 13/63* (2014.01)
*G06F 30/12* (2020.01)
*G06F 30/13* (2020.01)
*G06N 3/049* (2023.01)

(52) U.S. Cl.
CPC .............. *A63F 13/63* (2014.09); *G06F 30/12* (2020.01); *G06F 30/13* (2020.01); *G06N 3/049* (2013.01)

(58) Field of Classification Search
CPC .......... A63F 13/63; G06F 30/13; G06F 30/12; G06N 3/049
See application file for complete search history.

(56) References Cited

U.S. PATENT DOCUMENTS

| | | | | |
|---|---|---|---|---|
| 2014/0087871 A1* | 3/2014 | Kruglick | ............... | A63F 13/213 463/31 |
| 2020/0279151 A1* | 9/2020 | Li | ........................... | G06N 3/045 |
| 2021/0365603 A1* | 11/2021 | Gu | .......................... | G06F 30/13 |
| 2023/0325677 A1* | 10/2023 | Toizumi | ............... | G06F 40/103 706/16 |

OTHER PUBLICATIONS

Hu R, Huang Z, Tang Y, Van Kaick O, Zhang H, Huang H. Graph2plan: Learning floorplan generation from layout graphs. ACM Transactions on Graphics (TOG). Jul. 8, 2020;39(4):118-. (Year: 2020).*
Wang K, Savva M, Chang AX, Ritchie D. Deep convolutional priors for indoor scene synthesis. ACM Transactions on Graphics (TOG). Jul. 30, 2018;37(4):1-4. (Year: 2018).*

(Continued)

*Primary Examiner* — Chuen-Meei Gan
(74) *Attorney, Agent, or Firm* — Gray Ice Higdon

(57) ABSTRACT

This specification describes a computer-implemented generative interior design method. The method comprises obtaining input data comprising boundary data. The boundary data defines a boundary of an interior region of a video game building. A floor plan for the interior region of the video game building is generated. This comprises processing the input data using a floor plan generator model. The floor plan divides the interior region into a plurality of interior spaces. A layout for at least one of the plurality of interior spaces defined by the floor plan is generated by a layout generator model comprising one or more graph neural networks. The layout represents a configuration of one or more objects to be placed in the interior region.

20 Claims, 7 Drawing Sheets

(56) References Cited

OTHER PUBLICATIONS

Wang, et al., Deep Convolutional Priors for Indoor Scene Synthesis, ACM Transactions on Graphics, vol. 37, No. 4, Article 70, 14 pages, Aug. 2018.
Wu et al., Data-driven Interior Plan Generation for Residential Buildings, ACM Transactions on Graphics 38(6), 2019.
Hu et al., Graph2Plan; Learning Floorplan Generation from Layout Graphs, ACM Trans. Graph., vol. 39, No. 4, Article 1, arXiv:2004.13204v1 [cs.CV], Retrieved from: https://arxiv.org/pdf/2004.13204.pdf, 14 pages, Apr. 27, 2020.
Leskovec, Stanford CS224W: Graph Neural Networks, Stanford University, 85 pages, Oct. 7, 2021.
Yang, et al., Graph Neural Network for Generative Furniture Arrangment, Journal of Computer-Aided Design and Computer Graphics, Mar. 2021.

\* cited by examiner

GENERATIVE INTERIOR DESIGN IN VIDEO GAMES

BACKGROUND

The generation and customization of the interior design of buildings is an important part of video game development. Further, in some video games, such as life-simulation games, it may be desirable to allow a player to generate and customize interiors of buildings in accordance with their preferences.

SUMMARY

In accordance with a first aspect, this specification describes a computer-implemented generative interior design method. The method comprises obtaining input data comprising boundary data. The boundary data defines a boundary of an interior region of a video game building. A floor plan for the interior region of the video game building is generated. This comprises processing the input data using a floor plan generator model. The floor plan divides the interior region into a plurality of interior spaces. A layout for at least one of the plurality of interior spaces defined by the floor plan is generated by a layout generator model comprising one or more graph neural networks. The layout represents a configuration of one or more objects to be placed in the interior region.

In accordance with a second aspect, this specification describes a computing system for generative interior design. The system comprises a floor plan generator model and a layout generator model. The layout generator model comprises one or more graph neural networks. The system is configured to obtain input data comprising boundary data. The boundary data defines a boundary of an interior region of a video game building. A floor plan for the interior region of the video game building that divides the interior region into a plurality of interior spaces is generated. This comprises processing the input data using the floor plan generator model. A layout for at least one of the plurality of interior spaces defined by the floor plan is generated by the layout generator model. The layout represents a configuration of one or more objects to be placed in the interior region.

In accordance with a third aspect, this specification describes a computer-implemented generative interior design method to generate a layout for an interior region of a video game building using a graph neural network. The method comprises initializing an instance of a graph to be operated on by the graph neural network. For each iteration of a plurality of iterations, the method further comprises adding a node to the graph. Each node of the graph represents an interior space within the interior region, or an object to be placed in the interior region. Adding a node to the graph comprises processing a current representation of the graph using the graph neural network. Edges between nodes of the graph are generated by the graph neural network. An edge between two nodes specifies relational information between two respective interior space of the video game building or relational information between two respective objects to be placed in the interior region.

DETAILED DESCRIPTION

Figure 1:
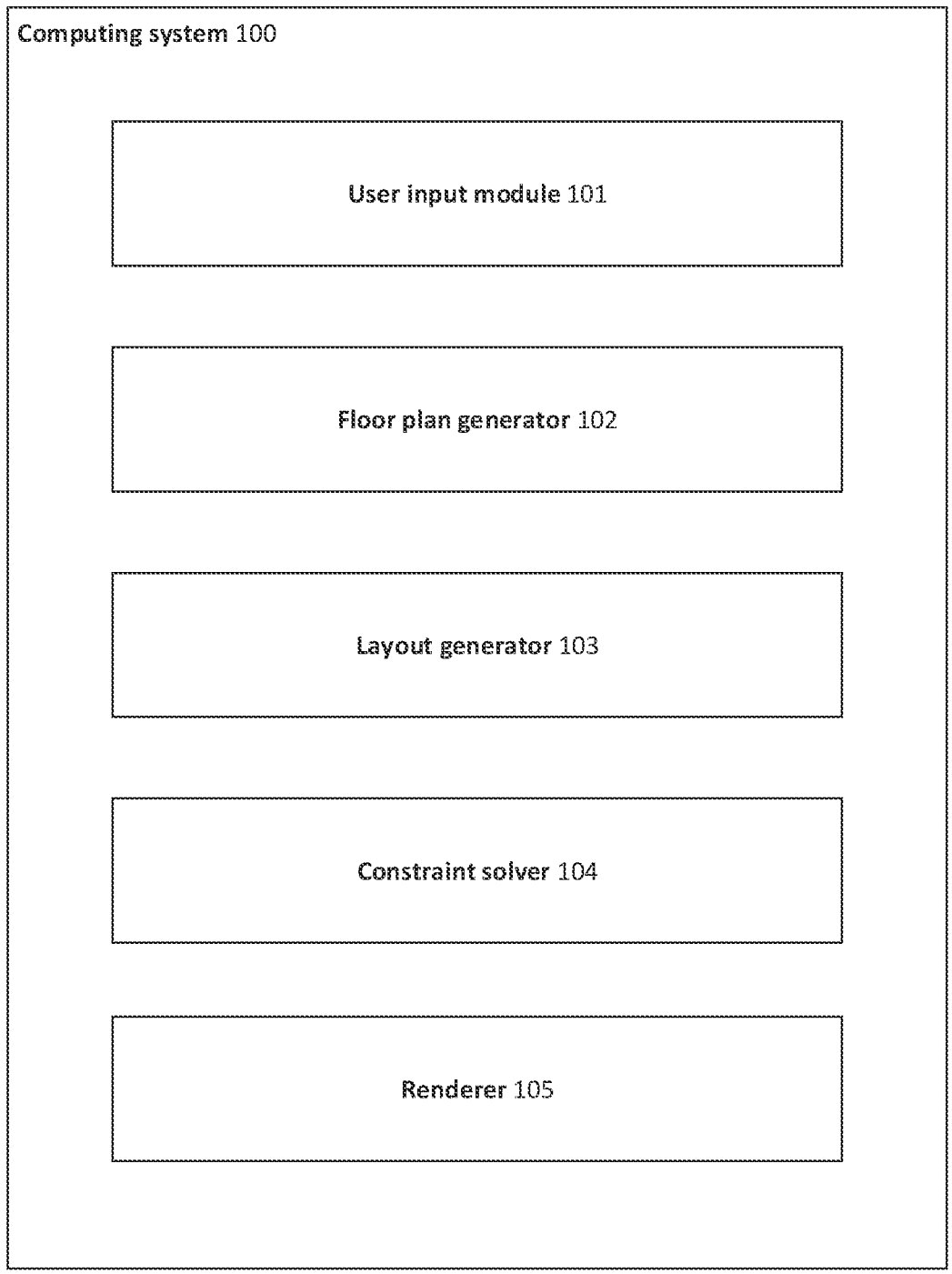
FIG. 1 is a schematic block diagram illustrating an example of a computer system for generative interior design.

Example implementations provide systems and methods for generative interior design of video game buildings using graph neural networks. In the described systems and methods, a layout generator model comprising one or more graph neural networks is used to generate a layout for at least one interior space (e.g. a room, such as a kitchen, bedroom, or living room, or other interior spaces such as hallways, entries, etc.) that form part of an interior region of the video game building. The layout may represent a configuration of one or more objects to be placed in the interior region of the video game building. Graph neural networks may also be used to generate floor plans for the interior region of a video game building, wherein the floor plan divides the interior region into a plurality of interior spaces.

In particular embodiments, the described systems and methods use a two-stage approach to generate a layout of an interior region of the video game building. In a first stage, users (e.g. players of a video game) can specify constraints such as the boundary of the interior region and the number of interior spaces to guide the generation. These constraints are input into a floor plan generator model that produces one or more outputs that each represent a floor plan. A floor plan divides the interior of the building into a plurality of interior spaces (e.g. bedroom, living room, kitchen, entry, hallway etc.). In some implementations, the floor plan generator model may further output a score for each floor plan, and users may select a floor plan from the top ranked suggestions and continue with the layout generation process. In a second stage, users can specify further constraints such as a budget constraint (e.g. in relation to an in-game currency) and/or a style constraint, and request for suggestions for where and how to place objects (e.g. furniture, appliances, etc.) in the interior spaces of the selected floor plan. In this second stage, a layout generator model comprising one or more graph neural networks generates outputs for at least one interior space of a floor plan. These outputs represent a configuration of one or more objects to be placed in the interior region of the video game building. The described systems and methods provide a tool to design pre-built interior spaces, train different floor plan styles, train various interior styles, and optimize furniture selection that may be constrained by budget and style. Further, the described systems and methods allow players of the video game to customize the interior design of buildings based on their preferences and/or in-game constraints (e.g. style and budget).

By using one or more graph neural networks in the layout generator model, the described systems and methods enable a flexible approach to generating interiors of buildings. For example, the described systems and methods may allow for interactive generation of building interiors, as users may edit layouts generated by the layout generator model. Such edits may be reflected in one or more graphs operated on by the graph neural network(s). For example, a user may decide to move or otherwise modify an object (e.g. a couch) represented in the outputs generated by the layout generator, and the graph may be updated to specify that the object is in the new configuration. The graph neural network may operate on this updated graph to generate further layouts (e.g. adding additional objects, removing objects and/or modifying the previous configuration of objects) wherein the object is in the configuration specified by the user.

FIG. 1 is a schematic block diagram illustrating an example of a computer system 100 for generative interior design. The computing system 100 may be used or accessed during a video game development process when developing the interior design of buildings for video games, and/or used or accessed by players of a video game when generating the interior design of buildings while playing the video game.

The computing system 100 comprises a user input module 1$o$1, a floor plan generator 102, a layout generator 103, a constraint solver 104, and a renderer 105.

The user input module is configured to receive a user input, which may be received by any appropriate input mechanism such as by a user interacting with a user interface. The user input comprises boundary data defining an interior region of the video game building for which the user wishes to generate a layout. The boundary data may be determined from a number of possible input mechanisms, such as a user drawing out the boundary, by upload of an image representing the boundary, etc. The boundary data may be an image, or equivalently, a matrix, that indicates where the boundary lies. For example, black pixels (or values of 1 in a matrix) may indicate an edge of the boundary, and white pixels (or values of 0) may indicate an interior of the building. Additionally or alternatively, the boundary data may be coordinates that specify where the boundary lies.

The user input may comprise additional inputs. For example, the user input may comprise a number of interior spaces that are to be generated in the layout of the interior of the building. An interior space may be a room (e.g. bedroom, kitchen, living room, etc.) or any other interior space (e.g. a hallway, an entry, etc.) In some embodiments, the term "interior spaces" as used herein includes spaces that are extensions of, adjacent and/or connected to fully interior spaces. For example, the interior spaces may include a balcony, a patio, a terrace, roofdecks, and other spaces that are often reflected in floor plans. The user input may comprise a constraint in the selection of a particular interior style (e.g. "European", "Scandinavian", "Modern", "Traditional", etc.) specifying a style for the interior. The user input may comprise a budget constraint that specifies a maximum amount of an in-game currency that a user wishes to spend on objects that are to be placed in the interior region of the building. For example, different objects (e.g. furniture items) may cost different amounts of the in-game currency, and the user may wish to generate an interior of the building with a total cost that is less than or equal to a certain budget. In some implementations, the user input may comprise a set of objects that are desired to be placed in the interior of the building.

The floor plan generator 102 comprises one or more trained machine-learning models for use in generating one or more floor plans for the interior region of the building. As will be described in greater detail in relation to FIG. 2, the floor plan generator receives the input data comprising the boundary data defining the boundary of the interior region of the building, and optionally, a number of interior spaces, and generates the one or more floor plans in accordance with the input data. The floor plan generator 102 may comprise one or more graph neural networks and/or one or more generator neural networks of a conditional generative adversarial network. In general, trained neural networks comprise parameters that have been learned after training the neural networks on one or more tasks using training data, as will be described in relation to FIG. 2.

The floor plan generator 102 may output one or more outputs that each represent a floor plan in the form of an image, or a matrix. A floor plan is a division of the interior region of the building into a plurality of interior spaces (e.g. bedrooms, living rooms, hallways). In some embodiments, the term "interior spaces" as used herein includes spaces that are extensions of, adjacent and/or connected to fully interior spaces. For example, the interior spaces may include a balcony, a patio, a terrace, roofdecks, and other spaces that are often reflected in floor plans. For example, the output may be an image wherein regions of the interior corresponding to each interior space is denoted by a different pixel value. Alternatively, the output may be a matrix wherein subregions of the interior corresponding to each interior space is denoted by a different label corresponding to a type of interior space (e.g. "Living Room", "Bathroom", "Hallway") or integer values corresponding to the labels. An example floor plan is illustrated by floor plan 203 of FIG. 2. Multiple different floor plans for the boundary may be generated by the floor plan generator 102.

The floor plan generator 102 may also output a score for each floor plan. The score may indicate how realistic the floor plan is, which may be determined as a result of the floor plan generator being trained with training examples comprising examples of floor plans. The score may be determined using predefined metrics, which can be precomputed based on a set of training examples. The predefined metrics may measure aspects relating to how realistic the floor plan is (e.g. as measured by aspect ratios for various interior spaces defined by the floor plan) and/or whether or not the floor plan is aligned with the user constraints (e.g. whether the generated floor plan has a number of interior spaces as specified by the user, and/or whether the floor plan exceeds a user-defined budget). For example, if a generated floor plan specifies a narrow bedroom, then a negative score may be determined for the generated floor plan, whereas a generated floor plan that specifies a narrow entryway may have a higher score. As another example, a generated floor plan that specifies only two interior spaces may have a lower score if the user specified to generate floor plans for three interior spaces. The floor plan generator 102 may generate a ranked list of floor plans, which may be filtered (e.g. such that only floor plans with a sufficiently high score are included in the list), and presented to the user in order to select a sufficiently realistic floor plan for the second stage of the layout generation process.

The layout generator 103 comprises one or more trained graph neural networks. A graph neural network operates on graphs comprising nodes and edges between nodes, using a plurality of layers of the graph neural network, to generate predictions of node features and, optionally, edge features. The layout generator 103 generates one or more outputs for each interior space of a floor plan, wherein each output represents a different layout for the interior space. Thus, the layout generator 103 can be used to generate multiple different layouts for each interior space of a particular floor plan.

In particular, each output generated for an interior space represents a configuration of one or more objects to be placed in the interior space. The objects include furniture (e.g. wardrobes, couches, tables, etc.), appliances (washing machines, televisions, refrigerators), or any other suitable object to be placed for the building. The graph operated on by the graph neural network comprises a number of nodes, each representing a configuration of an object (e.g. position, orientation, size), and a number of edges between nodes. The configuration of an object may be specified relative to the interior space, or relative to other objects. For example, a position (and/or size/orientation) of a coffee table may be specified relative to a TV, or be specified relative to a living room in which the coffee table is placed. The graph may be an undirected graph. Each edge may comprise one or more edge features. For example, an edge feature may specify a distance between objects corresponding to the nodes linked by the edge. The graph for a particular interior space may be fully connected and a distance may be determined between each pair of objects represented by the nodes. A distance may be a single number (e.g. corresponding to a Euclidean distance), or may be a distance vector that is comprised of several components that each denote a distance along a particular axis. For example, one component may specify a distance in a horizontal axis, and another component may specify a distance in a vertical axis. An example of a graph produced by a graph neural network is described in relation to FIG. 4.

In some implementations, the layout generator 103 may comprise a different graph neural network for each type of interior space of a set of interior space types. For example, one graph neural network may be used to produce object configurations for living rooms, another may be used to produce object configurations for bathrooms, etc. In this way, the layouts generated by layout generator 103 may be adapted to specific interior spaces specified in a generated floor plan. The layout generator 103 may receive a floor plan generated by floor plan generator 102, and determine that the floor plan specifies one or more types of interior spaces. Subsequently, the layout generator 103 may cause a graph neural network associated with each type of interior space to generate a layout for the interior space corresponding to the interior space type. For example, the floor plan generator 102 may generate a floor plan that specifies that the interior region of the building comprises a living room, a kitchen, and an entry. In this example, the layout generator 103 receives the floor plan, and determines that a graph neural network for living rooms should generate a layout for the living room, a graph neural network for kitchens should generate a layout for the kitchen, and that a graph neural network for entries should generate a layout for the entry.

An output for an interior space may be a representation of a graph produced by a graph neural network of the layout generator 103. For example, the representation of the graph may comprise a matrix of vectors, wherein each vector comprises features for a particular node of the graph, and may further comprise a matrix or tensor specifying edge features. The node features may represent a configuration for a particular object (e.g. position, orientation, size), and the edge features may represent a distance between two objects corresponding to the nodes linked by the edge.

In scenarios where the user further provides constraints (e.g. a budget constraint and/or a style constraint), constraint solver 104 may be used to generate a set of objects that satisfy the constraints. For example, the computing system 100 may store or otherwise access a set of game assets of objects, where each game asset is tagged with tags corresponding to the constraints. For example, each game asset may have a cost tag denoting a cost for the object, and/or a style tag denoting a particular style for the object. The constraint solver 104 can filter and select a subset of objects, and provide this subset of objects to the layout generator 103 so that the layout for the interior of the building is generated using a subset of objects satisfy the constraints. The constraint solver may determine a subset of objects in any suitable manner, e.g. by filtering game assets that do not meet the constraints, and/or performing a constraint optimization process, e.g. by use of linear programming methods, branch-and-bound algorithms, etc.

The interior of the building may be rendered, displayed and/or caused to be displayed in a video game based on the outputs produced by layout generator 103. The renderer 105 is configured to receive the outputs produced by layout generator 103 and render the interior of the building in accordance with the object configurations specified in the output of the layout generator 103. For example, the renderer 105 may receive positional information, orientation information and/or size information for each object specified in the outputs of the layout generator 103. The renderer 105 may determine appropriate game assets (e.g. texture data) for the objects specified in the outputs of the layout generator 103 and render the interior of the building using the determined game assets. The renderer 105 may be part of a video game application that is accessed when players play the video game, or may be part of a video game development application for developing building interiors.

Figure 2:
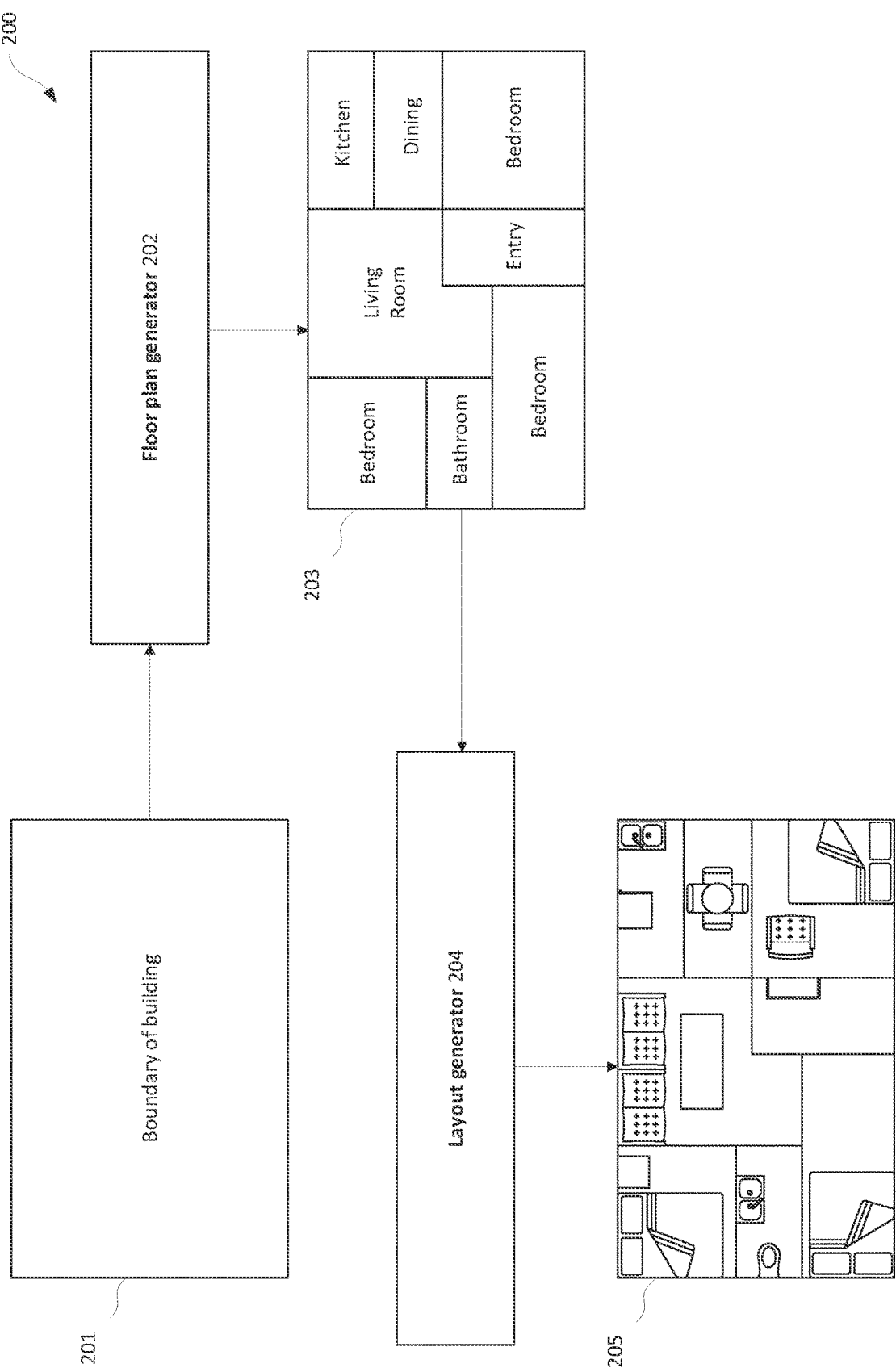
FIG. 2 illustrates an example generative interior design method.

FIG. 2 illustrates an example generative interior design method 200. The method 200 illustrates the two-stage process described previously, involving the use of a floor plan generator 202 to generate a floor plan 203 in a first stage, and the use of a layout generator 204 to generate a layout 205 in a second stage.

Floor plan generator 202 receives boundary data defining a boundary 201 of an interior region of a video game building. The boundary 201 may be represented by an image, or equivalently, a matrix, that indicates where the boundary lies. For example, black pixels (or values of 1 in a matrix) may indicate an edge of the boundary, and white pixels (or values of 0) may indicate an interior region of the building. Additionally or alternatively, the boundary 201 may be represented by coordinates that specify where the boundary lies.

The floor plan generator 202 processes the boundary data and generates one or more outputs that each represent a floor plan 203. The floor plan generator 202 may output one or more outputs that each represent a floor plan in the form of an image, or a matrix, that represent a division of the interior region of the building into a plurality of interior spaces. For example, the output may be an image wherein subregions of the interior region corresponding to different types of interior spaces are denoted by a different pixel value. Alternatively, the output may be a matrix wherein subregions of the interior region corresponding to each type of interior space is denoted by a different label (e.g. "Living Room", "Bathroom", "Hallway"), or integer values corresponding to labels. As shown by example floor plan 203, the floor plan 203 may comprise multiple interior spaces of the same type of interior space (e.g. "Bedroom" in floor plan 203). The floor plan generator 202 may also output a score for each floor plan.

The floor plan generator 202 comprises one or more machine-learning models that have been trained to generate outputs representing floor plans 203. The machine-learning models comprise parameters that have been learned after a training process utilizing training examples. The training examples used to train the floor plan generator 202 comprise pairs of training inputs and associated target outputs. The training input of a training example comprises boundary data defining a boundary of an interior region of the building 201, and optionally, a number of interior spaces in the target output. The target output comprises data representing a floor plan 203. The training examples may be determined from real-world examples of floor plans and/or from examples of floor plans generated for video game buildings. The training process involves performing a number of training iterations, wherein at each iteration, the training input of one or more training examples are processed in accordance with a current set of parameters, and a predicted output is generated for each training input. The parameters of the machine-learning model are updated using an optimization process which optimizes a loss function that compares the predicted output of a training example with the corresponding target output of the training example. For example, the loss function may comprise a reconstruction loss that is optimized to minimise differences between the predicted output and the target output. Any suitable optimization process may be used, e.g. gradient-descent based methods such as stochastic gradient descent, mini-batch gradient descent, batch gradient descent, AdaGrad, Adam, RMSProp, etc.

The floor plan generator 202 may comprise a generator neural network of a conditional generative adversarial network. The generator neural network may be trained using an adversarial training process, which makes use of a discriminator neural network to evaluate the likelihood that an output generated by the generator neural network is "real" data. The adversarial training process comprises training a generator to generate outputs that are realistic (e.g. when compared to target outputs of a training dataset) such that the discriminator neural network inaccurately predicts the outputs generated by the generator neural network to be "real" data (e.g. data from a set of real training examples), while simultaneously learning a discriminator that aims to accurately distinguish between "real" data and "synthetic" data that is generated by the generator neural network. The generator neural network may be configured to receive a latent vector (e.g. sampled from a noise distribution), and a conditioning input, and process these inputs to generate outputs representing a floor plan in accordance with the conditioning input. The conditioning input may comprise boundary data defining a boundary of an interior region of the video game building, and may further comprise data representing a number of interior spaces for the floor plan. The generator neural network and/or discriminator neural network may comprise one or more convolutional layers.

Alternatively, the floor plan generator 202 may comprise a graph neural network comprising a plurality of graph neural network layers. Generating an output representing a floor plan may comprise performing a graph building process that adds nodes to a graph operated on by the graph neural network, wherein each node represents a particular type of interior space (e.g. bedroom, living room, kitchen, etc.). Multiple interior spaces of the same type of interior space may be added to the graph. The graph may be initialized in a suitable manner, e.g. by selection of a random seed, by choosing a type of interior space that is frequently occurring in the training examples, by user selection etc. Node features may also be generated for each node by the graph neural network. Node features for each interior space may comprise positional information for the interior space that specify a subregion of the interior region of the building that is occupied by the interior space.

At each iteration of the graph building process, a portion of the graph neural network may process a current representation of the graph using one or more neural network layers to generate a prediction of whether a node corresponding to a particular type of interior space should be added to the graph. The representation of the graph may comprise a matrix of vectors, wherein each vector comprises node features for a particular node of the graph, and may further comprise a matrix or tensor specifying edge features. The portion of the graph neural network may comprise a softmax layer that produces an output for each type of interior space, representing a probability that a node corresponding to the interior space type should be added to the graph. In an example where the types of interior space consist of a living room, a bedroom, a hallway, and a kitchen, the softmax layer generates an output for each of a living room, a bedroom, a hallway, and a kitchen. The softmax layer may further include an output corresponding to a null type, representing a probability that no new node should be added to the graph. Additionally or alternatively, the graph neural network may receive an input specifying a number of interior spaces to be added to the floor plan, and terminate the graph building process once the number of nodes in the graph equals the number of interior spaces specified in the input. The graph neural network may comprise a further portion that processes the representation of the graph for the iteration and generates node features for the newly added node.

The layout generator 204 comprises one or more trained graph neural networks. A graph neural network operates on graphs comprising nodes and edges between nodes, using a plurality of layers of the graph neural network, to generate predictions of node features and edge features. In particular, the graph neural network is configured to process a representation of the graph using a plurality of graph neural network layers that each generate a node embedding for each node of the graph. The representation of the graph may comprise a matrix of vectors, wherein each vector comprises node features for a particular node of the graph, and may further comprise a matrix or tensor specifying edge features. The node features may represent a configuration for a particular object (e.g. position, orientation, size), and the edge features may represent relational information between two objects corresponding to the nodes linked by the edge. For example, the relational information may specify an adjacency relationship that e.g. indicates the two objects are in the same interior space, a distance between the objects, a constraint for the two objects (e.g. that specifies the two objects should be of a particular style) or any other relational information. Distances between two objects may be specified by edge features for an edge between two nodes corresponding to the two objects, or may be directly calculated from node features for each of the two nodes that specifies positional information for the object. The layout generator 204 generates one or more outputs for at least one interior space of a floor plan, wherein each output represents a different layout for the interior space. An output for an interior space may be a representation of a graph produced by a graph neural network. In some implementations, the layout generator 204 may comprise a different trained graph neural network for each type of interior space of a set of interior space types.

The layout generator 204 comprises a graph neural network comprising a plurality of graph neural network layers, in addition to neural network layers used to generate predictions of node features and, optionally, edge features. The graph neural network layers are arranged in a sequence of layers, wherein graph neural network layers receive inputs from outputs produced by a previous graph neural network layer in the sequence.

A first graph neural network layer receives the node features of each node, and processes the node features to generate a first node embedding for each node. For example, the first graph neural network layer may receive positional information, orientation information, and size information for each of a coffee table, a TV, and a sofa in the form of node feature vectors, which are combined (e.g. concatenated) to form an input to the first graph neural network layer. These node features are processed using parameters associated with the first graph neural network layer to generate the first node embedding for each of the coffee table, the TV, and the sofa. Node embeddings are vectors that represent properties of the objects as determined by the graph neural network.

Each of the subsequent graph neural network layers (i.e. following the first graph neural network layer) generates a node embedding for each node of the graph, using node embeddings produced by previous graph neural network layers. For each node of the graph, the subsequent graph neural network layer receives node embeddings for neighbours of the node, in addition to the node embedding for the node itself, produced by the previous graph neural network layer. The graph neural network layer combines the node embeddings, e.g. by performing an averaging, and performs a transformation of the combined node embeddings. For example, the transformation may comprise one or more linear transformations defined by learned parameters (e.g. one or more weight matrices). For example, a first weight matrix comprising learned parameters may be used to linearly transform node embeddings of neighbour nodes, and a second weight matrix/or vector comprising learned parameters may be used to linearly transform the node embedding of the node itself. The linearly transformed node embeddings may be combined (e.g. by a summation) and subsequently followed by a non-linear activation function (e.g. sigmoid, ReLu, tan h, etc.) to produce a node embedding for the node. A final graph neural network layer produces a final node embedding of each of the nodes of the graph.

Generating an output representing a layout 205 may comprise performing a graph building process that adds nodes to a graph operated on by the graph neural network, wherein each node represents a particular object type (e.g. chair, sofa, TV, etc.). Multiple objects of the same object type may be added to the graph. The graph may be initialized in a suitable manner, e.g. by selection of a random seed, by choosing an object type that is frequently occurring in the training examples, by user selection etc. Node features are also generated for each node by the graph neural network. Node features for each interior space may comprise positional information, orientation information, and/or size information for the object corresponding to the node. The graph building process also comprises adding edges between nodes. Edge features may also be generated for each edge by the graph neural network. Edge features between nodes may comprise a distance between objects corresponding to the nodes linked by the edge.

At each iteration of the graph building process, a portion of the graph neural network may process a current representation of the graph using one or more neural network layers to generate a prediction of whether a node corresponding to a particular object type (e.g. TV, coffee table, sofa) should be added to the graph. The representation of the graph may comprise a matrix of vectors, wherein each vector comprises node features for a particular node of the graph, and may further comprise a matrix or tensor specifying edge features. The portion of the graph neural network may comprise a softmax layer that produces an output for each object type, representing a probability that a node corresponding to the object type should be added to the graph. The softmax layer may include an output corresponding to a null type, representing a probability that no new node should be added to the graph. Additionally or alternatively, the graph neural network may receive an input specifying a number of objects to be added to the floor plan, and terminate the graph building process once the number of nodes in the graph equals the number of objects specified in the input.

A new node may be added to the graph based on outputs produced by the softmax layer. For example, a node corresponding to an object type with a highest score (or probability) in the output of the softmax layer may be added to the graph.

The graph neural network comprises a further portion comprising neural network layers that processes the representation of the graph for the iteration and generates node features for the newly added node. Node features may be generated by processing final node embeddings, wherein the final node embeddings are generated by a final graph neural network layer. The graph neural network may be configured to add an edge between the newly added node and all other nodes of the graph. The graph neural network may comprise a further portion comprising neural network layers that processes the representation of the graph for the iteration and generates edge features for the newly added edges. Edge features may be generated by processing pairs of final node embeddings corresponding to the nodes connected by an edge, wherein the final node embeddings of the pair are generated by the final graph neural network layer.

Figure 3:
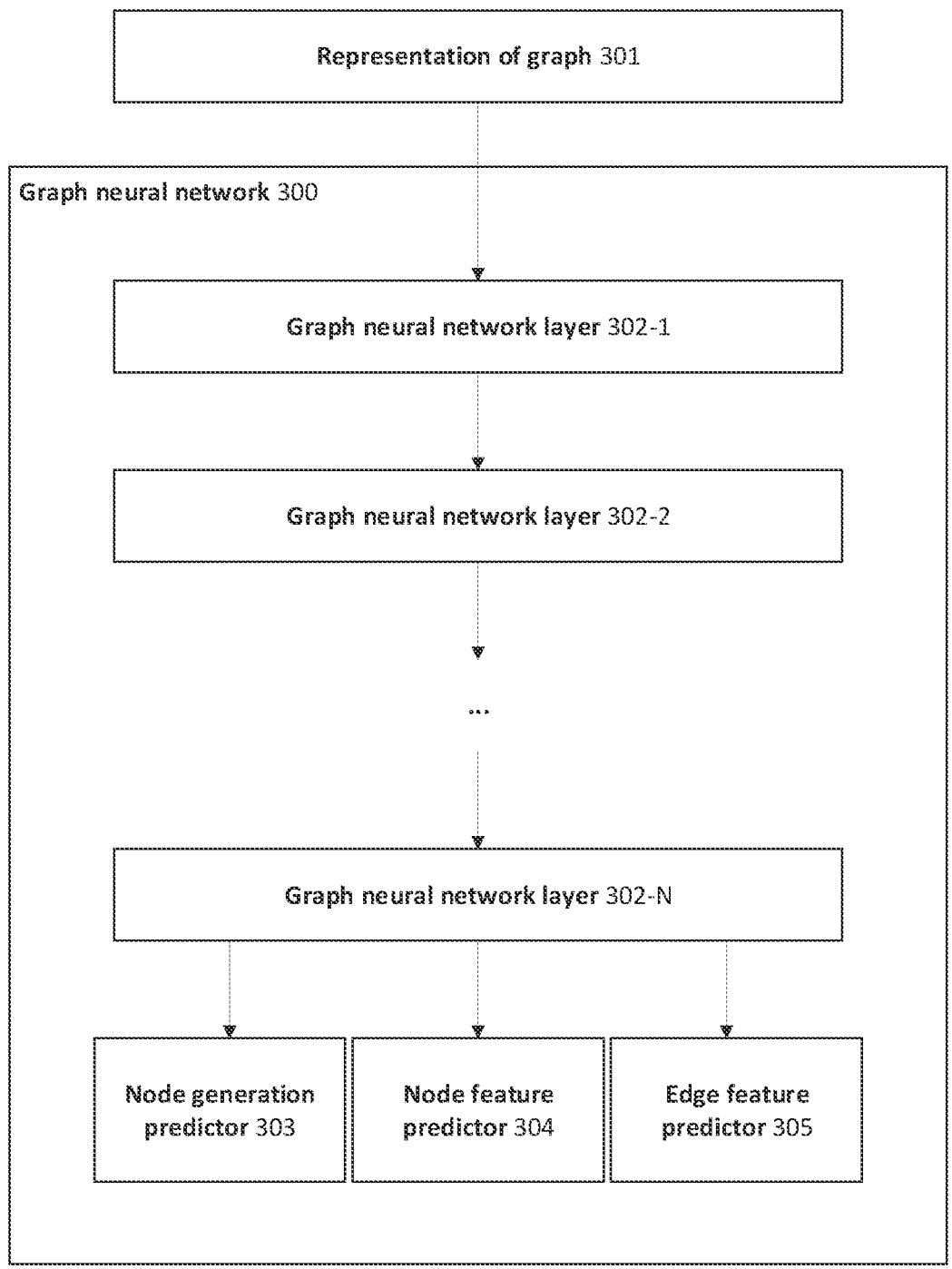
FIG. 3 illustrates an example graph neural network used for generating a layout for an interior region of a video game building.

Turning briefly to FIG. 3, FIG. 3 illustrates an example graph neural network 300 used for generating a layout for an interior region of a video game building. As described previously, the graph neural network 300 comprises a plurality of graph neural network layers 302-1, 302-2, 302-N that each generate a node embedding for each node of a graph operated on by the graph neural network 300. A first graph neural network 302-1 receives a representation of the graph 301 and produces a first node embedding for each node. Subsequent graph neural network layers 302-2, 302-N receive node embeddings produced by a previous graph neural network layer to generate the node embeddings for the layer 302-2, 302-N. Final node embeddings are output by a final graph neural network layer 302-N. The graph neural network 300 comprises a node generation predictor portion 303 which receives the final node embeddings and generates a probability for each type of node that can be added to the graph. The node generation predictor 303 may comprise a softmax layer, as described previously. The graph neural network 300 comprises a node feature predictor portion 304 which predicts node features (e.g. object configurations) for nodes of the graph by processing final node embeddings. The graph neural network 300 comprises an edge feature predictor portion 305 which predicts edge features (e.g. distances) for edges of the graph by processing final node embeddings. The node generation predictor 303, node feature predictor 304, edge feature predictor 305 each comprise one or more neural network layers.

Returning to FIG. 2, the graph neural network(s) comprise parameters that have been learned by a training process utilizing training examples. Each training example used to train the layout generator 204 comprises data representing a layout 205 that specifies object configurations of one or more objects placed in an interior region of a building. The training examples may be determined from real-world examples of layouts and/or from examples of layouts generated for video game buildings. The object configuration may comprise positional information, orientation information, and/or size information for the objects specified in the layout.

The training examples may represent the layout using node orderings that represent a sequence of nodes. The sequence of nodes may specify a sequence for which the graph neural network should add nodes to the graph to be operated on by the graph neural network during processing of the training example. For each training example, a training input and corresponding target output may be determined for each iteration of a plurality of iterations, wherein the training input for an iteration comprises a representation of a graph comprising nodes of a first portion of the node ordering (e.g. the first 3 nodes of a node ordering), and the target output for the iteration comprises a representation of a graph comprising nodes of the first portion of the node ordering and, in addition, a subsequent node of the node ordering (e.g. the first 4 nodes of the node ordering). For both of the training input and target output of an iteration, the corresponding representation of the graph for the iteration also comprises edge features for edges between the nodes specified in the graph.

For example, a layout of a training example may specify object configurations for each of a coffee table, a TV, and a sofa. A node ordering may specify the training example in a sequence of: coffee table, TV, and sofa. The graph neural network may be trained to process the training example and first add a node corresponding to the coffee table to a graph. The graph neural network may process the representation of the graph to generate an object configuration for the coffee table. The graph neural network may then add a node corresponding to the TV, generate an object configuration for the TV, and finally add a node corresponding to the sofa, and generate an object configuration for the sofa. Before adding a new node at a subsequent iteration, the graph neural network may generate edge features for edges between each node and each other node of the graph for the current iteration. The node orderings may be determined from the training example (e.g. by random selection), or provided in this format already in the target output of a training example.

The training process involves performing a number of training iterations, wherein at each iteration, the training input of one or more training examples are processed in accordance with a current set of parameters, and a predicted output is generated for each training input. This comprises an iteration of a graph building process, as described before, using the current set of parameters for the graph neural network. The parameters of the graph neural network are updated using an optimization process which optimizes a loss function that compares the predicted output of a training example with the corresponding target output of the training example. For example, the loss function may comprise a reconstruction loss that is optimized to minimise differences between the predicted output and the target output. Any suitable optimization process may be used, e.g. gradient-descent based methods such as stochastic gradient descent, mini-batch gradient descent, batch gradient descent, Ada-Grad, Adam, RMSProp, etc.

Figure 4:
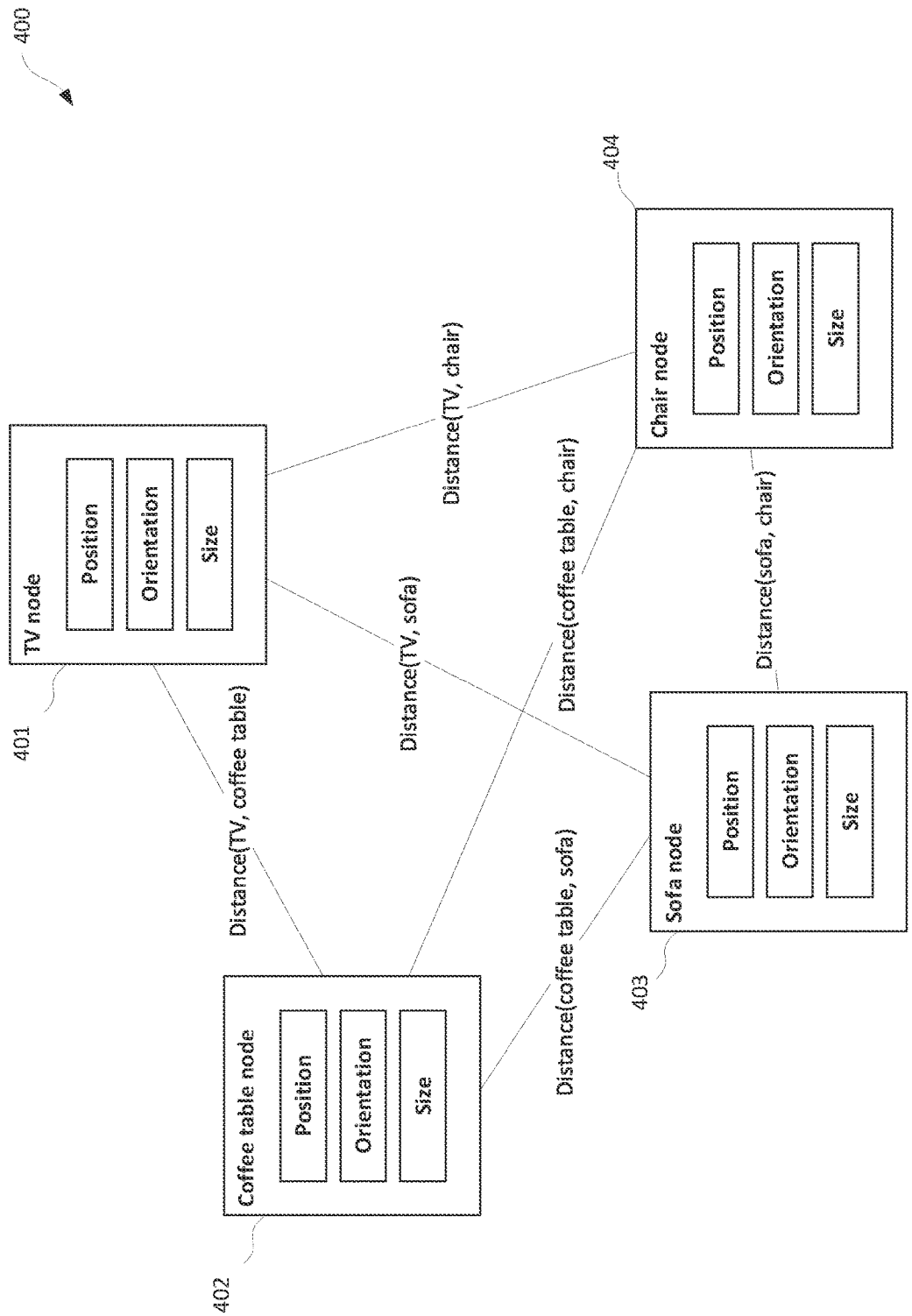
FIG. 4 illustrates an example graph representing the layout of an interior region of a video game building produced by a layout generator model comprising a graph neural network.

FIG. 4 illustrates an example graph 400 representing the layout of an interior space of a building produced by a layout generator model comprising a graph neural network. The example graph 400 displays four nodes 401, 402, 403, 404, each comprising node features specifying a position, orientation, and size of the object represented by the node. Furthermore, although each node is illustrated as being of a particular object type (e.g. node 401 being a TV node), the object type may be encoded in the node features of the node. For example, the node features may comprise a label indicating a particular node type. The label may be a one hot-encoding that represents a particular object type. It will be appreciated that one or more of the illustrated node features may be omitted, and one or more additional node features may be included in the node features.

The example graph 400 shown in FIG. 4 is a fully-connected undirected graph, meaning that each node of the graph is connected to each other by an undirected edge. As shown in FIG. 4, each edge is associated with edge features that represent the distance between the objects corresponding to the nodes linked by the edge.

Although the above description describes the use of a graph neural network for generating layouts of an interior space of a building, a graph neural network may be used to generate floor plans for video game buildings. In these examples, each node of the graph represents an interior space of a floor plan. Node features may comprise positional information for the interior space describing a subregion of the interior region of the video game building. The node features may further comprise a label indicating a particular type of interior space (e.g. kitchen, bathroom, hallway, etc.). For an edge between two nodes, edge features for the edge may comprise a distance between the two interior spaces corresponding to the nodes linked by the edge.

Figure 5:
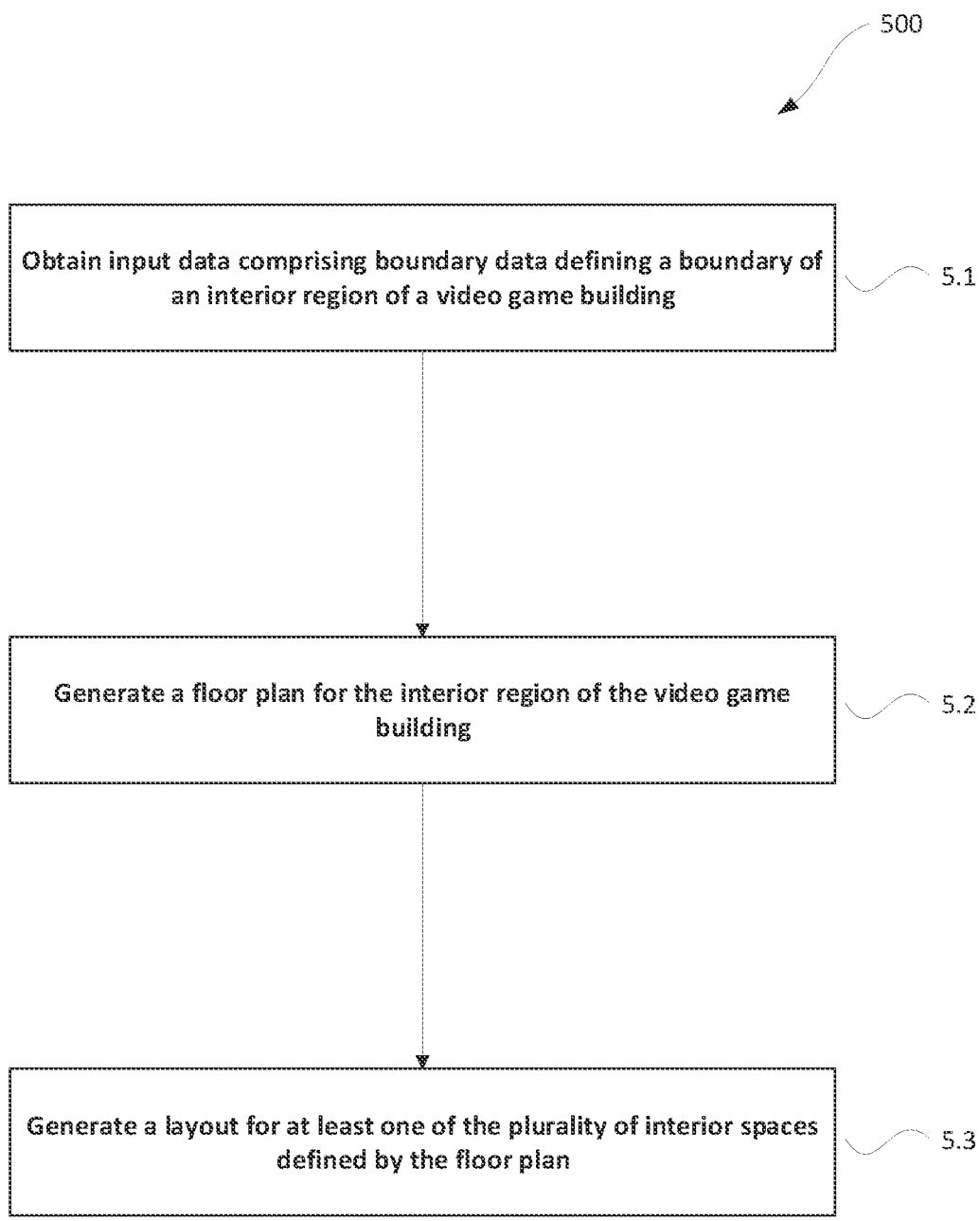
FIG. 5 is a flow diagram illustrating an example generative interior design method.

FIG. 5 is a flow diagram illustrating an example generative interior design method 500. This flowchart illustrates a general overview of methods described in relation to FIGS. 1 and 2.

In step 5.1, input data comprising boundary data defining a boundary of an interior region of a video game building is obtained. The input data may further comprise a number of interior spaces for the interior region of the video game building. The input data may further comprise one or more constraints. The one or more constraints may comprise at least one of: a style for the interior region; and a budget for the interior region.

In step 5.2, a floor plan is generated for the interior region of the video game building. In this step, the input data is processed by a floor plan generator model. The floor plan divides the interior region of the video game building into a plurality of interior spaces. The floor plan generator may generate a plurality of floor plans for the interior region of the video game building. The floor plan generator model may generate a score for each floor plan. The floor plan generator model may comprise a graph neural network. Additionally or alternatively, the floor plan generator model may comprise a generator neural network of a conditional generative adversarial network.

In step 5.3, a layout for at least one of the plurality of interior spaces defined by the floor plan is generated by a layout generator model comprising one or more graph neural networks. A layout represents a configuration of one or more objects to be placed in the interior region. The configuration of an object may comprise one or more of: positional information for the object; orientation information for the object; and size information for the object. The position information describes where the object is to be placed in the interior region. The orientation information describes how the object is to be placed in the interior region. The size information describes the size of the object to be placed in the interior region. The configuration of an object may be specified relative to the interior space, or relative to other objects. For example, a position (and/or size/orientation) of a coffee table may be specified relative to a TV, or be specified relative to a living room in which the coffee table is placed.

Generating the layout may comprise: initializing an instance of a graph to be operated on by the graph neural network. For each iteration of a plurality of iterations, a node may be added to the graph by the graph neural network. This may comprise processing a current representation of the graph using the graph neural network. Each node of the graph may represent an object to be placed in the interior region of the video game building. Edges between nodes of the graph may be generated by the graph neural network. An edge between two nodes may specify (e.g. as edge features) relational information between the objects corresponding to the nodes. For example, the relational information may specify an adjacency relationship that e.g. indicates the two objects are in the same interior space, a distance between the objects, a constraint for the two objects (e.g. that specifies the two objects should be of a particular style) or any other relational information.

The layout generator model may comprise a different graph neural network for each interior space type of a set of interior space types (e.g. bedroom, living room, entry, hallway, etc.). Each interior space of the floor plan may have a respective interior space type. A layout may be generated for each interior space using the graph neural network associated with the interior space type of the interior space.

Figure 6:
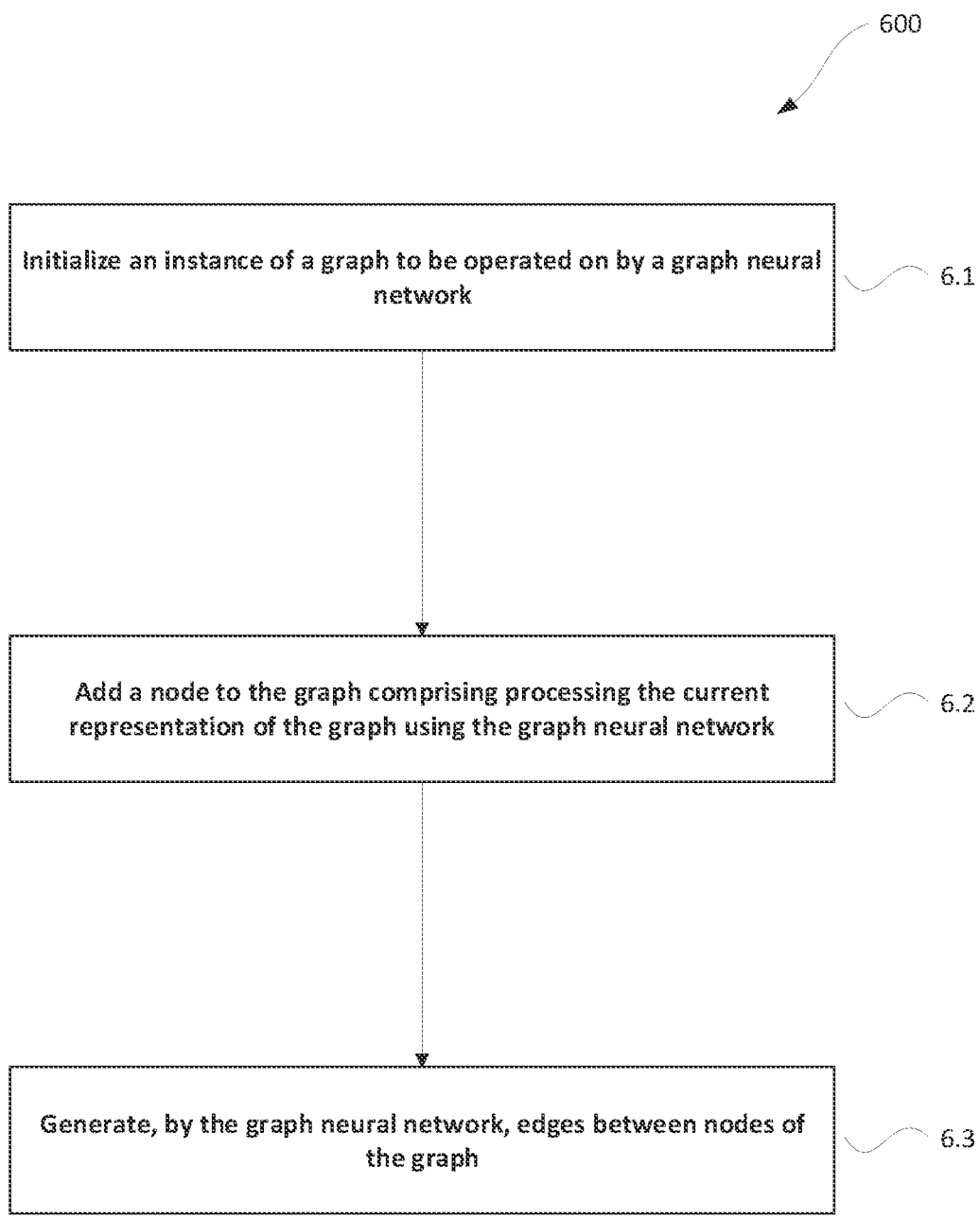
FIG. 6 is a flow diagram illustrating an example generative interior design method to generate a layout for an interior region of a video game building using a graph neural network.

FIG. 6 is a flow diagram illustrating an example generative interior design method 600 to generate a layout for an interior region of a video game building using a graph neural network. This flow diagram illustrates a general overview of methods described in relation to FIGS. 1 and 2.

In step 6.1, an instance of a graph to be operated on by the graph neural network is initialized.

Steps 6.2 and 6.3 are performed at each iteration of a plurality of iterations.

In step 6.2, a node is added to the graph, comprising processing a current representation of the graph using the graph neural network. Each node of the graph represents an interior space within the interior region, or an object to be placed in the interior region, wherein adding a node to the graph. Each node may represent a furniture item to be placed in the interior region of the video game building. The current representation of the graph may be processed using a plurality of graph neural network layers of the graph neural network. Each graph neural network layer may be configured to generate a node embedding for each node of the graph from the current representation of the graph. The graph neural network may comprise further neural network layers. For example, one or more neural network layers may be used to generate predictions of node features from node embeddings. One or more neural network layers may be used to generate predictions of edge features from pairs of node embeddings. One or more neural network layers may be used to generate predictions of whether nodes of a particular type should be added to the graph. For example, the one or more neural network layers may comprise a softmax layer that outputs a probability for each type of node of adding that node type to the graph.

The representation of the graph may comprise a matrix of vectors, wherein each vector comprises node features for a particular node of the graph, and may further comprise a matrix or tensor specifying edge features.

In step 6.3, edges between nodes of the graph are generated by the graph neural network. An edge between two nodes specifies relational information between two respective interior space of the video game building or relational information between two respective objects to be placed in the interior region. For example, the relational information may specify an adjacency relationship that e.g. indicates that two objects are in the same interior space, a distance between two objects, a distance between two interior spaces, a constraint for two objects (e.g. that specifies the two objects should be of a particular style) or any other relational information for the objects and/or interior spaces.

Generating edges between nodes of the graph may comprise processing, using one or more further neural network layers of the graph neural network, pairs of node embeddings corresponding to the nodes connected by an edge. The node embeddings of the pair are generated by a final graph neural network layer. A new representation of the graph may be determined after step 6.3.

The interior of the building may be rendered, displayed and/or caused to be displayed in a video game based on the outputs produced by graph neural network. Appropriate game assets (e.g. texture data) for the objects specified in the outputs of the graph neural network may be determined and the interior of the building may be rendered and/or displayed using the determined game assets while the video game is being played.

Figure 7:
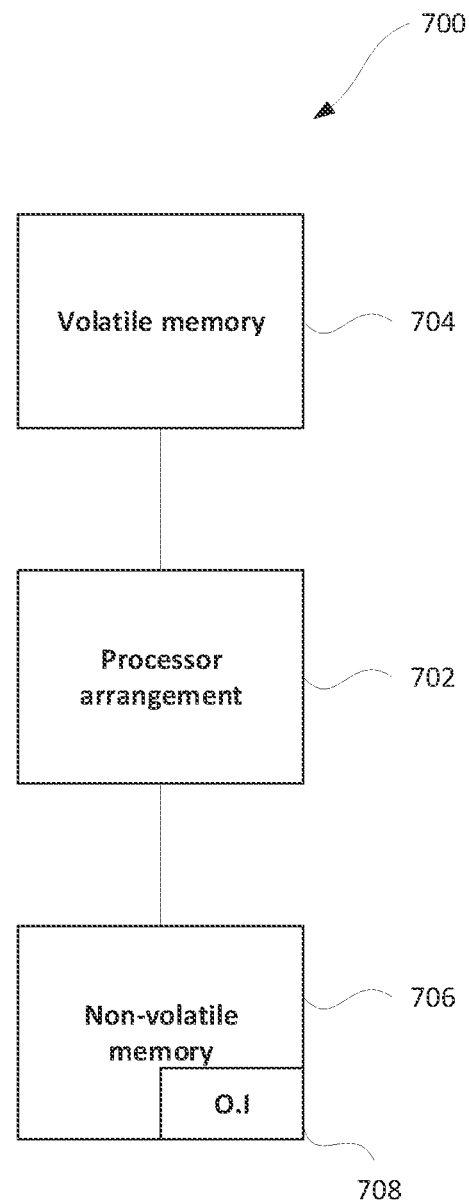
FIG. 7 shows a schematic example of a system/apparatus for performing any of the methods described herein.

FIG. 7 shows a schematic example of a system/apparatus for performing any of the methods described herein. The system/apparatus shown is an example of a computing device. It will be appreciated by the skilled person that other types of computing devices/systems may alternatively be used to implement the methods described herein, such as a distributed computing system.

The apparatus (or system) 700 comprises one or more processors 702. The one or more processors control operation of other components of the system/apparatus 700. The one or more processors 702 may, for example, comprise a general purpose processor. The one or more processors 702 may be a single core device or a multiple core device. The one or more processors 702 may comprise a central processing unit (CPU) or a graphical processing unit (GPU). Alternatively, the one or more processors 702 may comprise specialised processing hardware, for instance a RISC processor or programmable hardware with embedded firmware. Multiple processors may be included.

The system/apparatus comprises a working or volatile memory 704. The one or more processors may access the volatile memory 704 in order to process data and may control the storage of data in memory. The volatile memory 704 may comprise RAM of any type, for example Static RAM (SRAM), Dynamic RAM (DRAM), or it may comprise Flash memory, such as an SD-Card.

The system/apparatus comprises a non-volatile memory 706. The non-volatile memory 706 stores a set of operation instructions 708 for controlling the operation of the processors 702 in the form of computer readable instructions. The non-volatile memory 706 may be a memory of any kind such as a Read Only Memory (ROM), a Flash memory or a magnetic drive memory.

The one or more processors 702 are configured to execute operating instructions 708 to cause the system/apparatus to perform any of the methods described herein. The operating instructions 708 may comprise code (i.e. drivers) relating to the hardware components of the system/apparatus 700, as well as code relating to the basic operation of the system/apparatus 700. Generally speaking, the one or more processors 702 execute one or more instructions of the operating instructions 708, which are stored permanently or semi-permanently in the non-volatile memory 706, using the volatile memory 704 to temporarily store data generated during execution of said operating instructions 708.

Implementations of the methods described herein may be realised as in digital electronic circuitry, integrated circuitry, specially designed ASICs (application specific integrated circuits), computer hardware, firmware, software, and/or combinations thereof. These may include computer program products (such as software stored on e.g. magnetic discs, optical disks, memory, Programmable Logic Devices) comprising computer readable instructions that, when executed by a computer, such as that described in relation to FIG. 7, cause the computer to perform one or more of the methods described herein.

Any system feature as described herein may also be provided as a method feature, and vice versa. As used herein, means plus function features may be expressed alternatively in terms of their corresponding structure. In particular, method aspects may be applied to system aspects, and vice versa.

Furthermore, any, some and/or all features in one aspect can be applied to any, some and/or all features in any other aspect, in any appropriate combination. It should also be appreciated that particular combinations of the various features described and defined in any aspects of the invention can be implemented and/or supplied and/or used independently.

Although several embodiments have been shown and described, it would be appreciated by those skilled in the art that changes may be made in these embodiments without departing from the principles of this disclosure, the scope of which is defined in the claims.

It should be understood that the original applicant herein determines which technologies to use and/or productize based on their usefulness and relevance in a constantly evolving field, and what is best for it and its players and users. Accordingly, it may be the case that the systems and methods described herein have not yet been and/or will not later be used and/or productized by the original applicant. It should also be understood that implementation and use, if any, by the original applicant, of the systems and methods described herein are performed in accordance with its privacy policies. These policies are intended to respect and prioritize player privacy, and to meet or exceed government and legal requirements of respective jurisdictions. To the extent that such an implementation or use of these systems and methods enables or requires processing of user personal information, such processing is performed (i) as outlined in the privacy policies; (ii) pursuant to a valid legal mechanism, including but not limited to providing adequate notice or where required, obtaining the consent of the respective user; and (iii) in accordance with the player or user's privacy settings or preferences. It should also be understood that the original applicant intends that the systems and methods described herein, if implemented or used by other entities, be in compliance with privacy policies and practices that are consistent with its objective to respect players and user privacy.

The invention claimed is:

1. A computer-implemented generative interior design method to customize an interior region of a video game building in accordance with a user's preferences while playing the video game, comprising:

obtaining, based on user input directed to a computing device of a user, input data comprising:
(i) boundary data defining a boundary of the interior region of the video game building, and
(ii) constraint data defining one or more constraints for the interior region, wherein the constraint data comprises a budget that defines a maximum of in-game currency for the user to spend on objects to be placed in the interior region;

generating a floor plan for the interior region of the video game building, wherein the floor plan divides the interior region into a plurality of interior spaces, comprising processing the input data using a floor plan generator model;

generating, by a layout generator model comprising one or more graph neural networks, a layout for at least one of the plurality of interior spaces defined by the floor plan, the layout representing a configuration of one or more objects to be placed in the interior region;

wherein generating the layout comprises:
initializing an instance of a graph to be operated on by a graph neural network of the one or more graph neural networks;
for each iteration of a plurality of iterations:
adding a node to the graph, wherein each node of the graph represents an object to be placed in the interior region; and wherein adding a node to the graph comprises processing a current representation of the graph using the graph neural network comprising:
generating a probability distribution over node types;
selecting a node type based upon the generated probability distribution over node types; and
generating the node for adding to the graph based upon the selected node type; and
generating, by the graph neural network, edges between nodes of the graph, wherein an edge between two nodes specifies relational information between the objects corresponding to the nodes; and causing the interior region to be visually rendered for presentation to the user via a display of the computing device during gameplay of the video game and in response to additional user input.

2. The method of claim 1, further comprising generating a plurality of floor plans for the interior region of the video game building using the floor plan generator model; and
generating, by the floor plan generator model, a score for each floor plan.

3. The method of claim 1, wherein the input data further comprises a number of interior spaces for the interior region of the video game building.

4. The method of claim 1, wherein the one or more constraints for the interior region further comprise a style for the interior region.

5. The method of claim 1, wherein the layout generator model comprises a different graph neural network for each interior space type of a set of interior space types.

6. The method of claim 5, wherein each interior space of the floor plan has a respective interior space type, and a layout for each interior space is generated using the graph neural network associated with the interior space type of the interior space.

7. The method of claim 1, wherein the configuration of an object comprises one or more of:

positional information for the object, wherein the positional information describes where the object is to be placed in the interior region;
orientation information for the object, wherein the orientation information describes how the object is to be placed in the interior region;
size information for the object, wherein the size information describes the size of the object to be placed in the interior region.

8. The method of claim 1, wherein the floor plan generator model comprises a further graph neural network.

9. The method of claim 1, wherein the floor plan generator model comprises a generator neural network of a conditional generative adversarial network.

10. The method of claim 1, further comprising:
subsequent to causing the interior region to be visually rendered for presentation to the user via the display of the computing device:
obtaining, based on further additional user input directed to the computing device of the user, further additional input data comprising modification data defining one or more modifications to the interior region; and
updating, based on the processing the further additional input data, the instance of the graph to generate a further layout for at least one of the plurality of interior spaces defined by the floor plan.

11. A computing system for generative interior design to customize an interior region of a video game building in accordance with a user's preferences while playing the video game, the system comprising: a floor plan generator model and a layout generator model, wherein the layout generator model comprises one or more graph neural networks, and wherein the system is configured to:
obtain, based on user input directed to a computing device of a user, input data comprising:
(i) boundary data defining a boundary of the interior region of the video game building, and
(ii) constraint data defining one or more constraints for the interior region, wherein the constraint data comprises a budget that defines a maximum of in-game currency for the user to spend on objects to be placed in the interior region;
generate a floor plan for the interior region of the video game building that divides the interior region into a plurality of interior spaces, comprising processing the input data using the floor plan generator model; and
generating, by the layout generator model, a layout for at least one of the plurality of interior spaces defined by the floor plan, the layout representing a configuration of one or more objects to be placed in the interior region;
wherein, in generating the layout, the system is configured to:
initialize an instance of a graph to be operated on by a graph neural network of the one or more graph neural networks;
add a node to the graph, wherein each node of the graph represents an object to be placed in the interior region; and
wherein, in adding a node to the graph, the system is configured to:
process a current representation of the graph using a graph neural network of the one or more graph neural networks to generate a probability distribution over node types;
select a node type based upon the generated probability distribution over node types; and
generate the node for adding to the graph based upon the selected node type; and
cause the interior region to be visually rendered for presentation to the user via a display of the computing device during gameplay of the video game and in response to additional user input.

12. The system of claim 11 further comprising a user input module, wherein the user input module is configured to receive the user input, and wherein the one or more constraints further comprise a style for the interior region.

13. The system of claim 12 further comprising a constraint solver, wherein the constraint solver is configured to receive the one or more constraints; and
determine a set of objects that can be placed in the interior region of the video game building that satisfy the one or more constraints.

14. The system of claim 13, wherein each of the objects to be placed in the interior region of the video game building belongs in the set of objects determined by the constraint solver.

15. The system of claim 11, wherein the system is further configured to determine a game asset for each of the one or more objects specified in the layout, and the system further comprises a renderer that is configured to:
receive the generated layout representing the configuration of the one or more objects to be placed in the interior region; and
render the interior region of the video game building using the determined game assets.

16. A computer-implemented generative interior design method to generate a layout for an interior region of a video game building using a graph neural network in accordance with a user's preferences while playing the video game, the method comprising:
obtaining, based on user input directed to a computing device of a user, input data comprising constraint data defining one or more constraints for the interior region, wherein the constraint data comprises a budget that defines a maximum of in-game currency for the user to spend on objects to be placed in the interior region;
initializing an instance of a graph to be operated on by the graph neural network;
for each iteration of a plurality of iterations:
adding a node to the graph, wherein each node of the graph represents an interior space within the interior region, or an object to be placed in the interior region, wherein adding a node to the graph comprises:
processing a current representation of the graph using the graph neural network to generate a probability distribution over node types;
selecting a node type based upon the generated probability distribution over node types; and
generating the node for adding to the graph based upon the selected node type; and
generating, by the graph neural network, edges between nodes of the graph, wherein an edge between two nodes specifies relational information between two respective interior spaces of the video game building or relational information between two respective objects to be placed in the interior region; and
causing the interior region to be visually rendered for presentation to the user via a display of the computing device during gameplay of the video game and in response to additional user input.

17. The method of claim 16, wherein each node represents a furniture item to be placed in the interior region of the video game building.

18. The method of claim 16, wherein the nodes of the graph represent a plurality of interior spaces which form at least part of a floor plan for the video game building.

19. The method of claim 16, wherein the current representation of the graph is processed using a plurality of graph neural network layers of the graph neural network, wherein each graph neural network layer is configured to generate a node embedding for each node of the graph from the current representation of the graph.

20. The method of claim 19, wherein generating edges between the nodes of the graph comprises processing, using one or more further neural network layers of the graph neural network, pairs of node embeddings corresponding to the nodes connected by an edge, wherein the node embeddings of the pair are generated by a final graph neural network layer.

\* \* \* \* \*